(12) United States Patent
Liu et al.

(10) Patent No.: US 8,237,597 B2
(45) Date of Patent: Aug. 7, 2012

(54) SYSTEMS AND METHODS FOR SEMI-INDEPENDENT LOOP PROCESSING

(75) Inventors: Jingfeng Liu, Longmont, CO (US); Haotian Zhang, Longmont, CO (US); Hongwei Song, Longmont, CO (US)

(73) Assignee: LSI Corporation, Milpitas, CA (US)

( * ) Notice: Subject to any disclaimer, the term of this patent is extended or adjusted under 35 U.S.C. 154(b) by 71 days.

(21) Appl. No.: 12/887,327

(22) Filed: Sep. 21, 2010

(65) Prior Publication Data

US 2012/0068870 A1 Mar. 22, 2012

(51) Int. Cl.
*H03M 1/12* (2006.01)
(52) U.S. Cl. ........... 341/155; 341/139; 360/46; 360/51; 360/65
(58) Field of Classification Search .................. 341/139, 341/155; 360/46, 51, 65
See application file for complete search history.

(56) References Cited

U.S. PATENT DOCUMENTS

| | | | |
|---|---|---|---|
| 3,973,182 A | 9/1974 | Kataoka | |
| 3,973,183 A | 9/1974 | Kataoka | |
| 4,024,571 A | 5/1977 | Dischert et al. | |
| 4,777,544 A | 10/1988 | Brown et al. | |
| 5,130,866 A | 7/1992 | Klaassen et al. | |
| 5,220,466 A * | 6/1993 | Coker et al. | 360/46 |
| 5,237,325 A | 8/1993 | Klein et al. | |
| 5,278,703 A | 1/1994 | Rub et al. | |
| 5,309,357 A | 5/1994 | Stark et al. | |
| 5,341,249 A | 8/1994 | Abbott et al. | |
| 5,377,058 A | 12/1994 | Good et al. | |
| 5,384,671 A * | 1/1995 | Fisher | 360/51 |
| 5,422,760 A * | 6/1995 | Abbott et al. | 360/46 |
| 5,442,492 A * | 8/1995 | Cunningham et al. | 360/46 |
| 5,521,948 A | 5/1996 | Takeuchi | |
| 5,523,902 A | 6/1996 | Pederson | |
| 5,594,341 A | 1/1997 | Majidi-Ahy | |
| 5,668,679 A | 9/1997 | Swearingen et al. | |
| 5,696,639 A | 12/1997 | Spurbeck et al. | |
| 5,726,818 A * | 3/1998 | Reed et al. | 360/51 |
| 5,781,129 A | 7/1998 | Schwartz et al. | |

(Continued)

FOREIGN PATENT DOCUMENTS

FR 2904168 A1 1/2008

(Continued)

OTHER PUBLICATIONS

U.S. Appl. No. 12/663,319, filed Dec. 7, 2009, Ratnakar Aravind.

(Continued)

*Primary Examiner* — Khai M Nguyen
(74) *Attorney, Agent, or Firm* — Hamilton, DeSanctis & Cha

(57) ABSTRACT

Various embodiments of the present invention provide systems and methods for data processing. For example, a data processing circuit is discussed that includes an analog to digital converter circuit, a digital filter circuit, a data detector circuit, a mimic filter circuit, and a sample clock generation circuit. The analog to digital converter circuit is operable to receive a data input and to provide corresponding digital samples. The digital filter circuit is operable to receive the digital samples and to provide a filtered output. The data detector circuit is operable to perform a data detection process on the filtered output to yield a detected output. The mimic filter circuit is operable to receive the digital samples and to provide a mimicked output. The sample clock generation circuit is operable to provide a sample clock based at least in part on the detected output and the mimicked output.

22 Claims, 6 Drawing Sheets

U.S. PATENT DOCUMENTS

| | | | |
|---|---|---|---|
| 5,787,125 | A | 7/1998 | Mittle |
| 5,798,885 | A | 8/1998 | Saiki et al. |
| 5,835,295 | A | 11/1998 | Behrens |
| 5,844,920 | A | 12/1998 | Zook et al. |
| 5,852,524 | A | 12/1998 | Glover et al. |
| 5,892,632 | A | 4/1999 | Behrens |
| 5,955,783 | A | 9/1999 | Ben-Efraim |
| 5,970,104 | A | 10/1999 | Zhong et al. |
| 5,986,830 | A | 11/1999 | Hein |
| 5,987,562 | A | 11/1999 | Glover |
| 6,009,549 | A | 12/1999 | Bliss et al. |
| 6,023,383 | A | 2/2000 | Glover et al. |
| 6,037,886 | A * | 3/2000 | Staszewski et al. ............ 341/139 |
| 6,069,583 | A | 5/2000 | Silvestrin et al. |
| 6,081,397 | A | 6/2000 | Belser |
| 6,111,712 | A | 8/2000 | Vishakhadatta et al. |
| 6,208,478 | B1 | 3/2001 | Chiu et al. |
| 6,215,433 | B1 * | 4/2001 | Sonu et al. .................... 341/155 |
| 6,278,591 | B1 | 8/2001 | Chang |
| 6,400,518 | B1 | 6/2002 | Bhaumik et al. |
| 6,404,829 | B1 | 6/2002 | Sonu |
| 6,411,452 | B1 | 6/2002 | Cloke |
| 6,441,661 | B1 | 8/2002 | Aoki et al. |
| 6,490,110 | B2 | 12/2002 | Reed et al. |
| 6,493,162 | B1 | 12/2002 | Fredrickson |
| 6,519,102 | B1 | 2/2003 | Smith |
| 6,530,060 | B1 | 3/2003 | Vis et al. |
| 6,603,622 | B1 | 8/2003 | Christiansen et al. |
| 6,606,048 | B1 | 8/2003 | Sutardja |
| 6,633,447 | B2 | 10/2003 | Franck et al. |
| 6,646,822 | B1 | 11/2003 | Tuttle et al. |
| 6,657,802 | B1 | 12/2003 | Ashley et al. |
| 6,775,529 | B1 | 8/2004 | Roo |
| 6,788,484 | B2 | 9/2004 | Honma |
| 6,813,108 | B2 | 11/2004 | Annampedu et al. |
| 6,816,328 | B2 | 11/2004 | Rae |
| 6,839,014 | B2 | 1/2005 | Uda |
| 6,856,183 | B2 | 2/2005 | Annampedu |
| 6,876,511 | B2 | 4/2005 | Koyanagi |
| 6,912,099 | B2 | 6/2005 | Annampedu et al. |
| 6,963,521 | B2 | 11/2005 | Hayashi |
| 6,999,257 | B2 | 2/2006 | Takeo |
| 6,999,264 | B2 | 2/2006 | Ehrlich |
| 7,002,761 | B1 | 2/2006 | Sutardja et al. |
| 7,002,767 | B2 | 2/2006 | Annampedu et al. |
| 7,038,875 | B2 | 5/2006 | Lou et al. |
| 7,054,088 | B2 | 5/2006 | Yamazake et al. |
| 7,072,137 | B2 | 7/2006 | Chiba |
| 7,082,005 | B2 | 7/2006 | Annampedu et al. |
| 7,092,462 | B2 | 8/2006 | Annampedu et al. |
| 7,116,504 | B1 | 10/2006 | Oberg |
| 7,126,776 | B1 | 10/2006 | Warren, Jr. et al. |
| 7,136,250 | B1 | 11/2006 | Wu et al. |
| 7,154,689 | B1 | 12/2006 | Shepherd et al. |
| 7,167,328 | B2 | 1/2007 | Annampedu et al. |
| 7,171,608 | B2 * | 1/2007 | Aida et al. .................... 714/794 |
| 7,180,693 | B2 | 2/2007 | Annampedu et al. |
| 7,187,739 | B2 | 3/2007 | Ma |
| 7,191,382 | B2 | 3/2007 | James et al. |
| 7,193,544 | B1 | 3/2007 | Fitelson et al. |
| 7,193,798 | B2 | 3/2007 | Byrd et al. |
| 7,199,961 | B1 | 4/2007 | Wu et al. |
| 7,203,013 | B1 | 4/2007 | Han et al. |
| 7,206,146 | B2 | 4/2007 | Flynn et al. |
| 7,230,789 | B1 | 6/2007 | Brunnett et al. |
| 7,248,425 | B2 | 7/2007 | Byun et al. |
| 7,253,984 | B1 | 8/2007 | Patapoutian et al. |
| 7,265,937 | B1 | 9/2007 | Erden et al. |
| 7,301,717 | B1 | 11/2007 | Lee et al. |
| 7,308,057 | B1 | 12/2007 | Patapoutian |
| 7,323,916 | B1 | 1/2008 | Sidiropoulos et al. |
| 7,362,536 | B1 | 4/2008 | Liu et al. |
| 7,375,918 | B1 | 5/2008 | Shepherd et al. |
| 7,411,531 | B2 | 8/2008 | Aziz et al. |
| 7,420,498 | B2 | 9/2008 | Barrenscheen |
| 7,423,827 | B2 | 9/2008 | Neville et al. |
| 7,446,690 | B2 | 11/2008 | Kao |
| 7,499,238 | B2 | 3/2009 | Annampedu |
| 7,525,460 | B1 | 4/2009 | Liu et al. |
| 7,602,568 | B1 | 10/2009 | Katchmart |
| 7,620,101 | B1 | 11/2009 | Jenkins |
| 7,630,155 | B2 | 12/2009 | Maruyama et al. |
| 2002/0001151 | A1 | 1/2002 | Lake |
| 2002/0150179 | A1 | 10/2002 | Leis et al. |
| 2002/0176185 | A1 | 11/2002 | Fayeulle et al. |
| 2002/0181377 | A1 | 12/2002 | Nagata et al. |
| 2003/0095350 | A1 | 5/2003 | Annampedu et al. |
| 2004/0179460 | A1 | 9/2004 | Furumiya et al. |
| 2005/0046982 | A1 | 3/2005 | Liu et al. |
| 2005/0157415 | A1 | 7/2005 | Chiang |
| 2005/0243455 | A1 | 11/2005 | Annampedu |
| 2007/0064847 | A1 | 3/2007 | Gaedke |
| 2007/0071152 | A1 | 3/2007 | Chen et al. |
| 2007/0103805 | A1 | 5/2007 | Hayashi |
| 2007/0104300 | A1 | 5/2007 | Esumi et al. |
| 2007/0183073 | A1 | 8/2007 | Sutardja et al. |
| 2007/0230015 | A1 | 10/2007 | Yamashita et al. |
| 2007/0263311 | A1 | 11/2007 | Smith |
| 2008/0056403 | A1 | 3/2008 | Wilson |
| 2008/0080082 | A1 | 4/2008 | Erden et al. |
| 2008/0212715 | A1 | 9/2008 | Chang |
| 2008/0266693 | A1 | 10/2008 | Bliss et al. |
| 2009/0002862 | A1 | 1/2009 | Park |
| 2009/0142620 | A1 | 6/2009 | Yamamoto et al. |
| 2009/0245448 | A1 | 10/2009 | Ran et al. |
| 2009/0274247 | A1 | 11/2009 | Galbraith et al. |

FOREIGN PATENT DOCUMENTS

| | | |
|---|---|---|
| WO | WO 03/047091 | 6/2003 |
| WO | WO 2008/009620 | 1/2008 |

OTHER PUBLICATIONS

U.S. Appl. No. 12/851,475, filed Aug. 5, 2010, Annampedu, Viswanath.
U.S. Appl. No. 12/887,327, filed Sep. 21, 2010, Llu et al.
U.S. Appl. No. 12/894,221, filed Sep. 30, 2010, Yang et al.
U.S. Appl. No. 12/946,048, filed Nov. 15, 2010, Yang et al.
U.S. Appl. No. 12/947,962, filed Nov. 17, 2010, Liu et al.
U.S. Appl. No. 12/946,033, filed Nov. 15, 2010, Yang et al.
U.S. Appl. No. 12/955,789, filed Nov. 29, 2010, Annampedu et al.
U.S. Appl. No. 12/955,821, filed Nov. 29, 2010, Annampedu et al.
Annampedu and Aziz, "Adaptive Algorithms for Asynchronous Detection of Coded Servo Signals Based on Interpolation", IEEE Transactions on Magnetics, vol. 41, No. 10, Oct. 20, 2005, pp. 2890-2892.
Aziz and Annampedu, "Asynchronous Maximum Likelihood (ML) Detection of Servo repeatable Run Out (RRO) Data".
Aziz, Annampedu, "Interpolation Based Max.-Likelihood(ML) Detection Asynchronous Servo Repeatable Run Out Data", Digest, IEEE Int'l Mag. Conf. vol. 42 No. 10 pp. 2585-2587 Oct. 2006.

* cited by examiner

SYSTEMS AND METHODS FOR SEMI-INDEPENDENT LOOP PROCESSING

BACKGROUND OF THE INVENTION

The present inventions are related to systems and methods for data processing, and more particularly to systems and methods for loop processing.

Various data processing circuits have been developed that include one or more loops. For example, a data processing circuit may receive a data signal that repeats at a defined frequency. In some cases, such loops are adjusting multiple modifiable parameters together. This can result in loop oscillation and/or improper loop operation.

Hence, for at least the aforementioned reasons, there exists a need in the art for advanced systems and methods for data processing.

BRIEF SUMMARY OF THE INVENTION

The present inventions are related to systems and methods for data processing, and more particularly to systems and methods for loop processing.

Various embodiments of the present invention provide data processing circuits that include an analog to digital converter circuit, a digital filter circuit, a data detector circuit, a mimic filter circuit, and a sample clock generation circuit. The analog to digital converter circuit is operable to receive a data input and to provide corresponding digital samples. The digital filter circuit is operable to receive the digital samples and to provide a filtered output. The data detector circuit is operable to perform a data detection process on the filtered output to yield a detected output. The mimic filter circuit is operable to receive the digital samples and to provide a mimicked output. The sample clock generation circuit is operable to provide a sample clock based at least in part on the detected output and the mimicked output. In some cases, the circuits may be implemented as part of a storage device or a receiving device. In some instances of the aforementioned embodiments, the mimic filter circuit includes: a high pass filter circuit operable to amplify a high frequency component of the digital samples and to yield a boosted output; a low pass filter circuit operable to cutoff a high frequency component of the digital samples to yield a low pass output; and a summation circuit operable to sum the low pass output and the high boosted output to yield the mimicked output.

In some instances of the aforementioned embodiments, the circuits further include a digital filter loop circuit operable to provide a feedback control to the digital filter circuit. The feedback control is based at least in part on the detected output. In some such instances, the digital filter loop circuit includes a least mean squared error generator circuit operable to provide an error output based at least in part on a derivative of the detected output. In one particular instance, the circuit further includes a partial response target circuit operable to convolve the detected output with a target to yield the derivative of the detected output.

In other instances of the aforementioned embodiments, the sample clock generation circuit includes: a phase detector circuit operable to provide a phase error between derivative of the detected output and the mimicked output; and an interpolator circuit operable to interpolate a derivative of the phase error to yield the sample clock. In some such instances, the circuit further includes a partial response target circuit operable to convolve the detected output with a target to yield the derivative of the detected output.

In yet other instances of the aforementioned embodiments, the circuits further include a variable gain amplifier circuit operable to amplify an analog input and to provide the data input; and an automatic gain control loop circuit operable to provide a gain control feedback based at least in part on the mimicked output and a derivative of the detected output. The gain control feedback at least in part controls the amplification applied by the variable gain amplifier circuit. In some such instances, the automatic gain control loop circuit includes: an automatic gain control error forming circuit operable to provide a gain control error based at least in part on the derivative of the detected output and the mimicked output; and a digital to analog converter circuit operable to convert the gain control error to the gain control feedback. In particular instances, the circuit further includes a partial response target circuit operable to convolve the detected output with a target to yield the derivative of the detected output.

Other embodiments of the present invention provide data processing circuits that include a variable gain amplifier circuit, an analog to digital converter circuit, a digital filter circuit, a data detector circuit, a mimic filter circuit, and an automatic gain control loop circuit. The variable gain amplifier circuit is operable to amplify an analog input and to provide a data input. The analog to digital converter circuit is operable to receive a data input and to provide corresponding digital samples. The digital filter circuit is operable to receive the digital samples and to provide a filtered output. The data detector circuit is operable to perform a data detection process on the filtered output to yield a detected output. The mimic filter circuit is operable to receive the digital samples and to provide a mimicked output. The automatic gain control loop circuit is operable to provide a gain control feedback based at least in part on the mimicked output and a derivative of the detected output. The gain control feedback at least in part controls the amplification applied by the variable gain amplifier circuit.

In some instances of the aforementioned embodiments, the automatic gain control loop circuit includes an automatic gain control error forming circuit operable to provide a gain control error based at least in part on the derivative of the detected output and the mimicked output; and a digital to analog converter circuit operable to convert the gain control error to the gain control feedback. In various instances of the aforementioned embodiments, the circuit further includes a digital filter loop circuit operable to provide a feedback control to the digital filter circuit. In such instances, the feedback control is based at least in part on the detected output. In particular cases, the digital filter loop circuit includes a least mean squared error generator circuit operable to provide an error output based at least in part on a derivative of the detected output.

In other instances of the aforementioned embodiments, the circuit further includes a sample clock generation circuit that is operable to provide a sample clock to the analog to digital converter circuit. The sample clock is based at least in part on the detected output and the mimicked output. In some such instances, the sample clock generation circuit includes: a phase detector circuit operable to provide a phase error between derivative of the detected output and the mimicked output; and an interpolator circuit operable to interpolate a derivative of the phase error to yield the sample clock.

Yet other embodiments of the present invention provide methods for data processing. The methods include: performing a variable gain amplification on an analog input using a variable gain amplifier circuit to yield an analog output; performing an analog to digital conversion on the analog output to yield a series of digital samples, wherein each of the series of digital samples is synchronous to a sample clock; performing a digital filtering of the digital samples using a digital filter circuit to yield a filtered output, wherein the digital filtering is at least in part controlled by a filter feedback; performing a data detection process on the filtered output to yield a detected output; performing a mimicked filtering of the digital samples to yield a mimicked output; generating the filter feedback to the digital filter circuit based at least in part on a derivative of the detected output; generating the analog feedback signal to the variable gain amplifier circuit based at least in part on a combination of the mimicked output and a derivative of the detected output; and generating the sample clock based at least in part on a combination of the mimicked output and a derivative of the detected output. The magnitude of the variable gain amplification is controlled at least in part by an analog feedback signal.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for data processing, and more particularly to systems and methods for loop processing.

Figure 1:
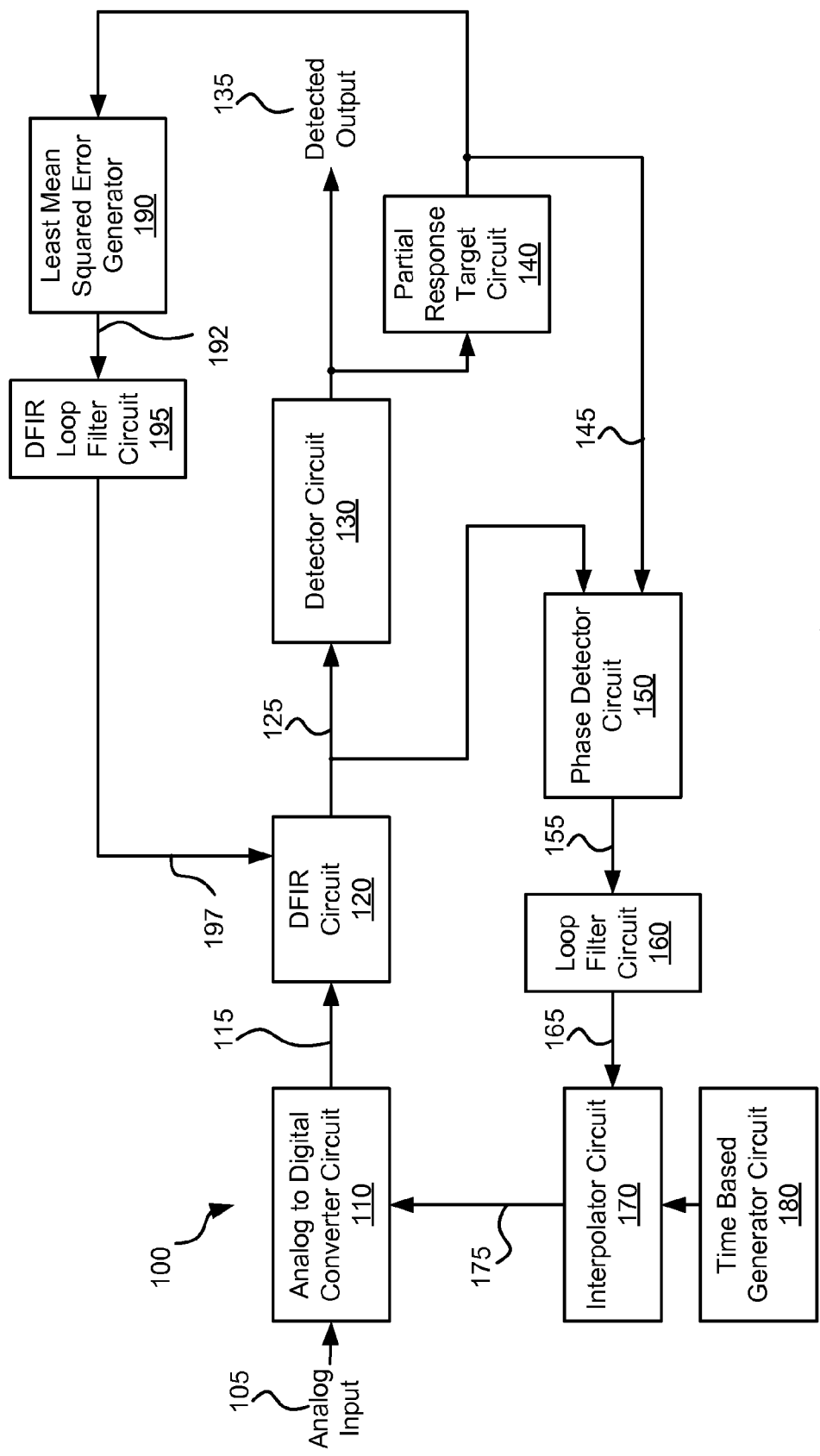
FIG. 1 depicts an existing timing recovery loop circuit.

Turning to FIG. 1, an existing timing recovery loop circuit 100 is depicted. Timing recovery loop circuit 100 includes an analog to digital converter circuit 110 that converts an analog input signal 105 into a series of digital samples 115 that are provided to a digital finite impulse response (DFIR) filter 120. DFIR filter 120 filters the received input and provides a corresponding filtered output 125 to both a detector circuit 130 and a phase detector circuit 150. Detector circuit 130 performs a data detection process on the received input resulting in a detected output 135. In performing the detection process, detector circuit 130 attempts to correct any errors in the received data input.

Detected output 135 is provided to a partial response target circuit 140 that creates a partial response output 145 compatible with filtered output 125. Detected output 135 is also provided to a least mean squared error generator circuit 190 that provides an error output 192 to a loop filter circuit 195. It should be noted that the least mean squared error generator circuit is one type of error generator circuit that may be used in relation to different embodiments of the present invention. Based upon the disclosure provided herein, one of ordinary skill in the art will recognize other types of error generator circuits that may be used in relation to different embodiments of the present invention. For example, a zero forcing error generator circuit or a hybrid zero forcing error generator circuit and least mean squared error generator circuit may be used in place of least mean squared error generator circuit 190. DFIR loop filter circuit 195 provides a filtered output 197 (i.e., filter taps) to DFIR circuit 120. The operation of DFIR circuit 120 is governed at least in part by filtered output 197.

Phase detector circuit 150 determines a phase difference between partial response output 145 and filtered output 125 and yields a phase error output 155. When timing recovery loop circuit 100 is properly synchronized to analog input 105, phase error output 155 goes to zero. Phase error output 155 is provided to a loop filter circuit 160 that filters the received input and provides a corresponding filtered output 165. Filtered output 165 is provided to an interpolator circuit 170 that is operable to determine an optimal sampling phase/frequency for a sampling clock 175. Sampling clock 175 is based on a clock input provided by a time based generator circuit 180. The next instance of analog input 105 is sampled by analog to digital converter circuit 110 synchronous to sampling clock 175.

As shown, timing recovery loop circuit 100 uses filtered output 125 to generate both filtered output 197 provided to DFIR circuit 120 and sampling clock 175. As filtered output 197 effects sampling clock 175 and sampling clock 175 effects filtered output 197, there is a possibility that the loops will be unstable. To limit the instability, filtered output 197 may be constrained. Further, the interaction can cause a change in the transfer function of DFIR circuit 120 resulting in sub-optimal operation of DFIR circuit 120.

Figure 2:
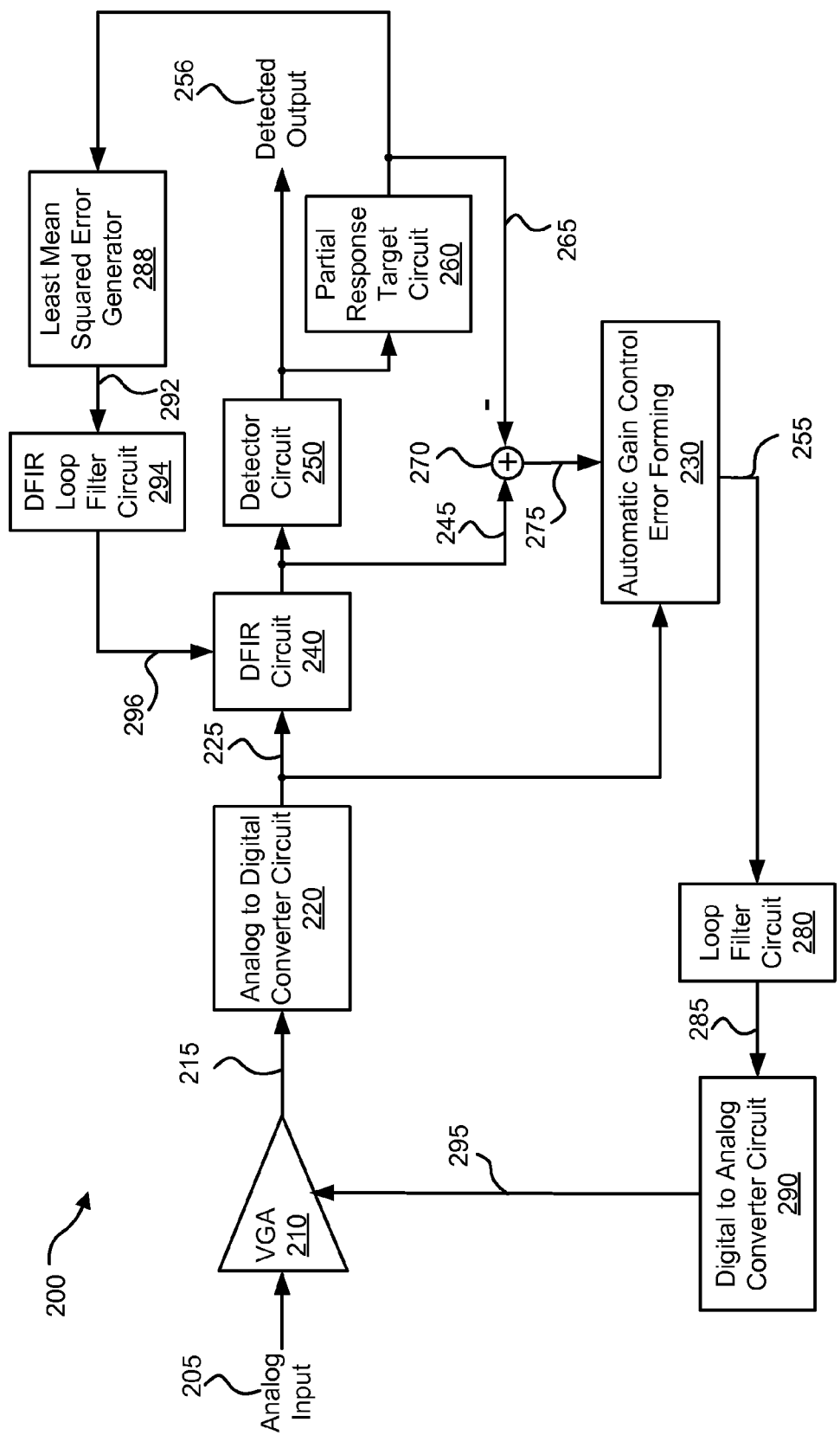
FIG. 2 depicts an existing automatic gain control loop circuit.

Turning to FIG. 2, depicts an existing automatic gain control loop circuit 200. Automatic gain control loop circuit 200 includes a variable gain amplifier 210 that receives an analog input 205. Variable gain amplifier 210 amplifies analog input 205 to yield an amplified output 215 that is provided to an analog to digital converter circuit 220. Analog to digital converter circuit 220 converts the received signal into a series of digital samples 225 that are provided to a DFIR circuit 240. DFIR circuit 240 filters the received input and provides a corresponding filtered output 245. In addition, digital samples 225 are provided to an automatic gain control error forming circuit 230.

Filtered output 245 is provided to both a detector circuit 250 and a summation circuit 270. Detector circuit 250 performs a data detection process on the received input resulting in a detected output 256. In performing the detection process, detector circuit 250 attempts to correct any errors in the received data input. Detected output 256 is provided to a partial response target circuit 260 that creates a partial response output 265 compatible with filtered output 245. Summation circuit 270 subtracts partial response output 265 from filtered output 245 to yield an error value 275. Error value 275 is provided to automatic gain control error forming circuit 230 where it is used to modify digital samples to yield an error feedback signal 255. Error feedback signal 255 is provided to a loop filter circuit 280 that filters the received input and provides a filtered output 285 to a digital to analog converter circuit 290. Digital to analog converter circuit 290 converts the received input to feedback signal 295. Feedback signal 295 governs the level of amplification applied by variable gain amplifier circuit 210.

Detected output 256 is also provided to a least mean squared error generator circuit 288 that provides an error output 292 to a loop filter circuit 294. It should be noted that the least mean squared error generator circuit is one type of error generator circuit that may be used in relation to different embodiments of the present invention. Based upon the disclosure provided herein, one of ordinary skill in the art will recognize other types of error generator circuits that may be used in relation to different embodiments of the present invention. For example, a zero forcing error generator circuit or a hybrid zero forcing error generator circuit and least mean squared error generator circuit may be used in place of least mean squared error generator circuit 288. DFIR loop filter circuit 294 provides a filtered output 296 (i.e., filter taps) to DFIR circuit 240. The operation of DFIR circuit 240 is governed at least in part by filtered output 296.

As shown, timing recovery loop circuit 200 uses filtered output 225 to generate both filtered output 296 provided to DFIR circuit 240 and feedback signal 295. As filtered output 296 effects feedback signal 295 and feedback signal 295 effects filtered output 296, there is a possibility that the loops will be unstable. To limit the instability, filtered output 296 may be constrained. Further, the interaction can cause a change in the transfer function of DFIR circuit 240 resulting in sub-optimal operation of DFIR circuit 240.

Various embodiments of the present invention provide data processing circuits that utilize semi-independent loop circuits limiting interaction between competing loop circuits and thus yielding greater loop stability. In particular, some embodiments of the present provide a data processing circuit with a combination timing recovery loop, automatic gain control loop and DFIR adaption loop circuit. In the circuit, the aforementioned loop circuits are semi-independent allowing for increased stability of operation. A mimicking circuit is employed to decouple the semi-dependent feedback loops.

Figure 3:
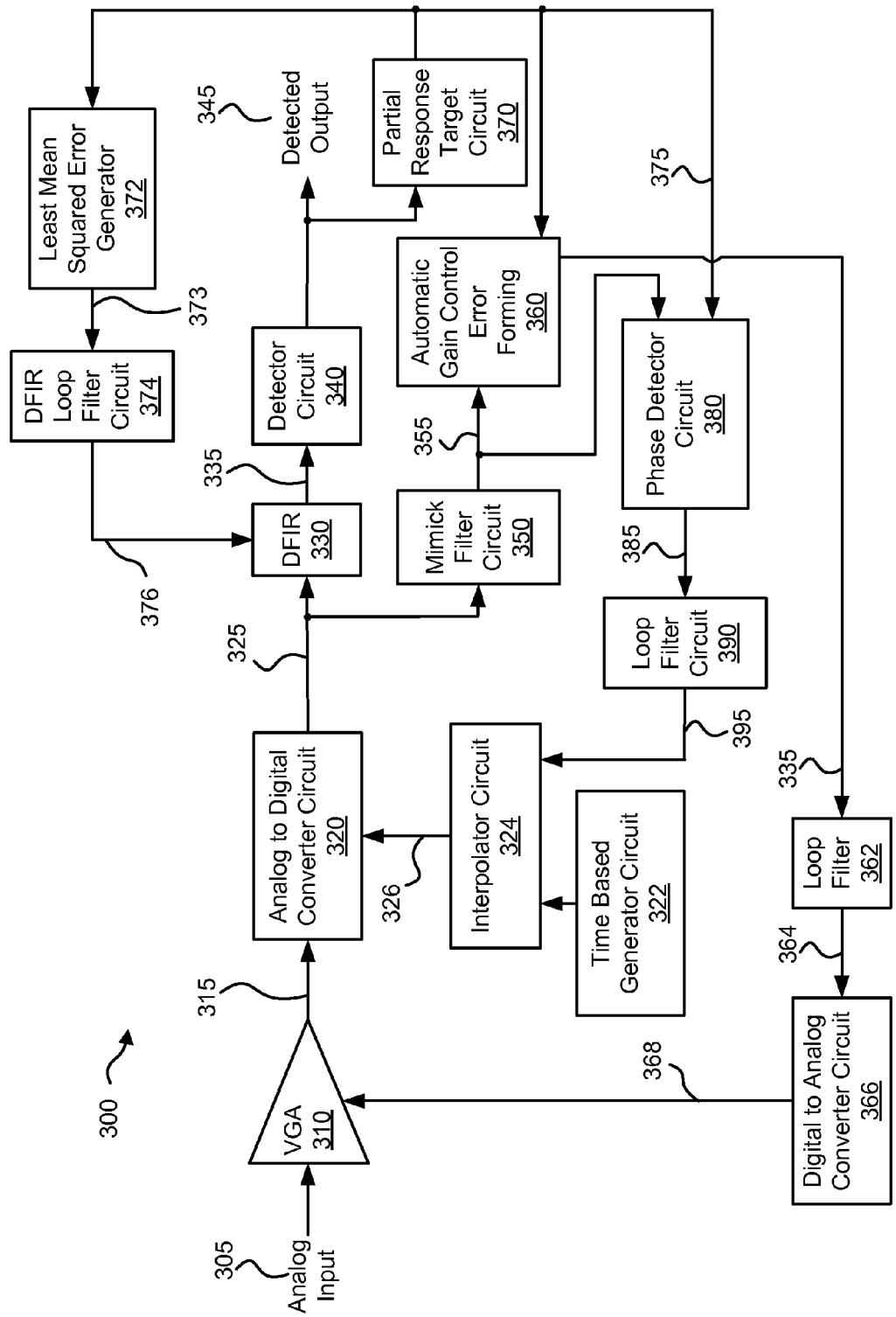
FIG. 3 depicts a combination automatic gain control loop and timing recovery loop circuit exhibiting semi-independence between a digital filter loop and the gain control and timing recovery loops in accordance with one or more embodiments of the present invention.

Turning to FIG. 3 a combination automatic gain control loop and timing recovery loop circuit 300 exhibiting independence between a digital filter loop and the gain control and timing recovery loops is shown in accordance with one or more embodiments of the present invention. Circuit 300 includes a variable gain amplifier 310 that receives an analog input 305. Variable gain amplifier 310 may be any circuit known in the art that is capable of amplifying a received signal by a gain that can be changed. Based upon the disclosure provided herein, one of ordinary skill in the art will recognize a variety of circuits that may be used to implement variable gain amplifier 310. Analog input 305 may be any analog signal carrying information to be processed. In some embodiments of the present invention, analog input 305 is derived from a storage medium. In other embodiments of the present invention, analog input 305 is derived from a transmission device. Based upon the disclosure provided herein, one of ordinary skill in the art will recognize a variety of analog signals and/or sources thereof that may be used in relation to different embodiments of the present invention.

Variable gain amplifier 310 amplifies analog input 305 to yield an amplified output 315 that is provided to an analog to digital converter circuit 320.

Analog to digital converter circuit 320 may be any circuit known in the art that is capable of converting an analog signal into a series of digital values representing the received analog signal. Analog to digital converter circuit 320 converts the received amplified output 315 into a series of digital samples 325 that are provided to a DFIR circuit 330. DFIR circuit 330 may be any circuit known in the art for filtering a digital signal. DFIR circuit 330 filters the received digital samples 325 and provides a corresponding filtered output 335 to a detector circuit 340. Detector circuit 340 may be any detector circuit known in the art including, but not limited to, a Viterbi algorithm detector circuit or a maximum a posteriori detector circuit. Based upon the disclosure provided herein, one of ordinary skill in the art will recognize a variety of detector circuits that may be used in relation to different embodiments of the present invention. Detector circuit 340 performs a data detection process on the received input resulting in a detected output 345. Detected output 345 may be provided to a downstream processor (not shown) that performs additional processing on the output.

In addition, detected output 345 is provided to a partial response target circuit 370 that creates a partial response output 375. Partial response output 375 is provided to a least mean squared error generator circuit 372 that provides an error output 373 to a DFIR loop filter circuit 374. It should be noted that the least mean squared error generator circuit is one type of error generator circuit that may be used in relation to different embodiments of the present invention. Based upon the disclosure provided herein, one of ordinary skill in the art will recognize other types of error generator circuits that may be used in relation to different embodiments of the present invention. For example, a zero forcing error generator circuit or a hybrid zero forcing error generator circuit and least mean squared error generator circuit may be used in place of least mean squared error generator circuit 372. DFIR loop filter circuit 374 provides a filtered output 376 (i.e., filter taps) to DFIR circuit 240. The operation of DFIR circuit 330 is governed at least in part by filtered output 376.

In addition, digital samples 325 are provided to a mimic filter circuit 350. Mimic filter circuit 350 operates to provide a reasonable approximation of filtered output 335, while not reacting immediately to changes in filtered output 376 that governs the operation of DFIR circuit 330. Mimic circuit 350 provides a mimicked output 355 to an automatic gain control error forming circuit 360. In addition, partial response output 375 is provided to automatic gain control error forming circuit 360. Automatic gain control error forming circuit 360 may be any circuit known in the art that is capable combining a post detector signal with a pre-detector signal to yield a gain control feedback compatible with a variable gain amplifier circuit. Automatic gain control error forming circuit 360 provides a gain control feedback signal 335 to a loop filter circuit 362 where it is filtered and provided as a filtered output 364. Filtered output 364 is provided to a digital to analog converted circuit 366 that converts the received signal into a corresponding analog feedback signal 368 that adjusts the magnitude of the amplification applied by variable gain amplifier circuit 310.

Mimicked output 355 is also provided to a phase detector circuit 380 that compares the phase difference between mimicked output 355 and partial response output 375. Phase detector circuit 380 may be any circuit known in the art that is capable of detecting a phase difference between two signals and providing an output corresponding to the phase difference. Phase detector circuit 380 provide a phase difference output 385. Phase difference output 385 is filtered by a loop filter circuit 390 that provides a filtered output 395 to an interpolator circuit 324. Interpolator circuit 324 is operable to determine an optimal sampling phase/frequency for a sampling clock 326. Interpolator circuit 324 may be any circuit known in the art that is capable of identifying a point between two samples that is appropriate for sampling future samples. Sampling clock 326 is based on a clock input provided by a time based generator circuit 322. The next instance of analog input 305 is sampled by analog to digital converter circuit 310 synchronous to sampling clock 326.

In operation, analog input signal 305 is received. In some cases, the analog input signal is derived from a storage medium. In other cases, the analog input signal is derived from a transmission medium. Based upon the disclosure provided herein, one of ordinary skill in the art will recognize other sources from which the analog input signal may be derived. Analog input 305 is provided to a variable gain amplifier circuit 310 where it is amplified to yield amplified output 315. Amplified output 315 is converted to a series of digital samples 325 synchronous to a sample clock 326.

DFIR circuit 330 applies digital filtering to digital samples 325 to yield filtered output 335. Filtered output 335 is provided to detector circuit 340 that performs a data detection process on the received input and provides detected output 345. Partial response target circuit 370 convolves detected output 345 with a target to yield partial response output 375. A least mean squared error is generated using partial response output 375 by least mean squared error generator circuit 372, and error output 373 is filtered by DFIR loop filter circuit 374 to yield filtered output 376 to DFIR circuit 330. Processing from digital samples 325 through DFIR circuit 330, detector circuit 340, partial response target circuit 370, least mean squared error generator circuit 372 and DFIR loop filter circuit 374 yielding filtered output 376 is a DFIR adaptation loop.

In addition, mimic filter circuit 350 performs a filtering on digital samples 325 that approximates the filtering performed by DIFR circuit 330 to yield mimicked output 355. Mimicked output 355 is provided to phase detector circuit 380 that provides a phase difference between mimicked output 355 and partial response output 375 to a loop filter circuit 390. The filtered output from loop filter circuit 390 is interpolated using interpolator circuit 324 to yield sample clock 326. Processing from digital samples 325 through mimic filter circuit 350, phase detector circuit 380, loop filter circuit 390 and interpolator circuit 324 yielding sample clock 326 is a timing recovery loop. Of note, by introducing mimic filter circuit 350, rather than using the output of DIFR circuit 330 directly, the timing recovery loop operates semi-independent from the DFIR adaptation loop.

Yet further, mimicked output 355 is provided to automatic gain control forming error circuit 360 that calculates an error difference between mimicked output 355 and partial response output 375. The calculated error is filtered and converted to analog feedback signal 368 that at least in part governs the magnitude of the amplification applied by variable gain amplifier circuit 310. Processing from digital samples 325 through mimic filter circuit 350, automatic gain control error forming circuit 360, loop filter circuit 362, and digital to analog converter circuit 366 to yield analog feedback signal 368 is an automatic gain control loop. Of note, by introducing mimic filter circuit 350, rather than using the output of DIFR circuit 330 directly, the automatic gain control loop operates semi-independent from the DFIR adaptation loop.

Figure 4:
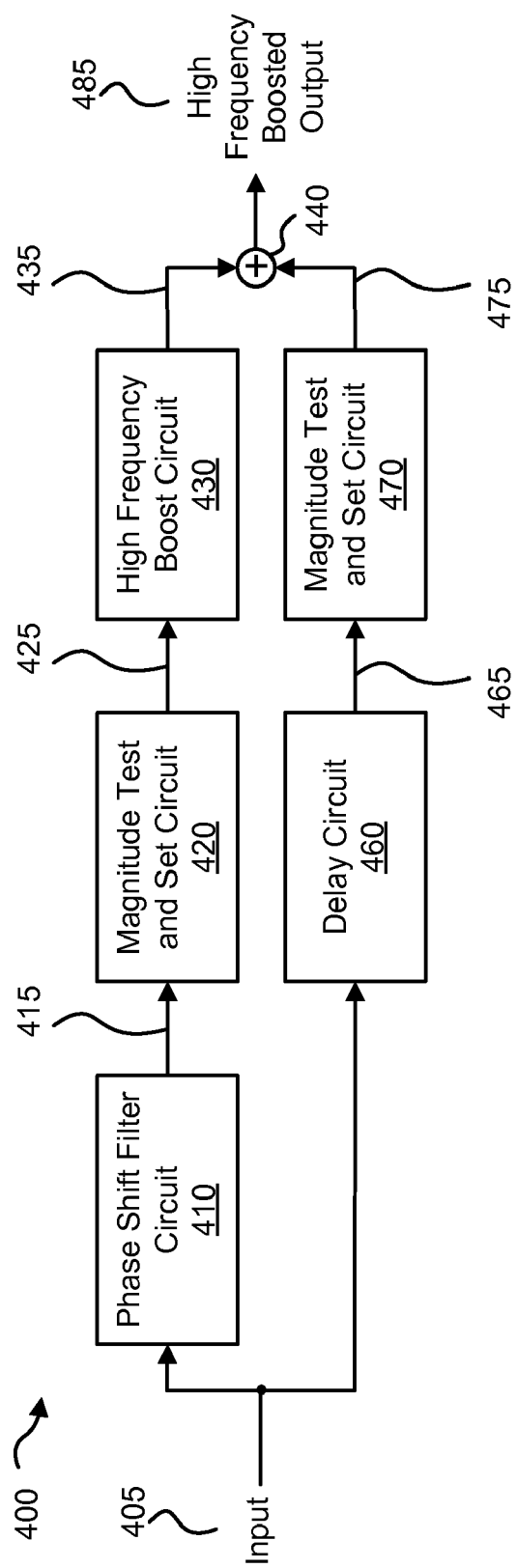
FIG. 4 shows a mimic filter circuit in accordance with some embodiments of the present invention that may be used in place of the mimic filter circuit of FIG. 3.

Turning to FIG. 4, a mimic filter circuit 400 is depicted in accordance with some embodiments of the present invention that may be used in place of mimic filter circuit 350. Mimic filter circuit 400 includes a phase shift filter circuit 410 provides a phase shift output 415. Phase shift filter circuit 410 shifts the phase to half way between the phase of the current sample and that of the previous sample in accordance with the following equation:

$$\text{Phase Shift Output } 415 = (1+D)/2,$$

where '1' represents the current sample phase, and D represents a storage element. Phase shift output 415 is provided to a magnitude test and set circuit 420 that compares the received input to a threshold value, and provides a set output 425 based upon the result of the comparison. In particular, magnitude test and set circuit 420 operates in accordance with the following pseudocode:

```
If (|Phase Shift Output 415| > Threshold)
{
    Set Output 425 = 0
}
Else
{
    Set Output 425 = Phase Shift Input 415
}
```

The value of the threshold variable may be programmable or fixed depending upon the particular implementation.

Set output 425 is provided to a high frequency boost circuit 430 that provides a boosted output 435 to a summation circuit 440. High frequency boost circuit 430 operates to amplify high frequency components of a signal and leave low frequency components unmodified. Thus, the combination of phase shift filter circuit 410, magnitude test and set circuit 420, and high frequency boost circuit 430 operate as a high pass filter circuit that amplifies frequencies above a frequency threshold.

In addition, mimic filter circuit 400 includes a delay circuit 450 that delays a received signal and provided a delayed signal 465 to a magnitude test and set circuit 470. Magnitude test and set circuit 470 provides a set output 475 to summation circuit 440. Magnitude test and set circuit 470 compares the received input to a threshold value, and provides set output 475 in accordance with the following pseudocode:

```
If (|Phase Shift Output 415| <= Threshold)
{
    Set Output 475 = 0
}
Else
{
    Set Output 475 = Delayed Signal 465
}
```

The value of the threshold variable is the same as that used in magnitude test and set circuit 420. The delay imposed by delay circuit 450 is designed to match the latency through phase shift filter circuit 410 and high frequency boost circuit 430, and thus aligning set output 475 with boosted output 435 (assuming the latency through magnitude test and set circuit 420 is approximately the same as the latency through magnitude test and set circuit 470). The combination of delay circuit 450 and magnitude test and set circuit 470 operate as a low pass filter circuit that amplifies frequencies above a frequency threshold.

In operation, an input 405 is received. In some cases, input 405 is a series of digital samples provided from an analog to digital converter circuit. Input 405 is high pass filtered through the combination of phase shift filter circuit 410, magnitude test and set circuit 420, and high frequency boost circuit 430 to yield boosted output 435. In parallel, input 405 is low pass filtered by the combination of delay circuit 450 and magnitude test and set circuit 470 to yield set output 475. Set output 475 is added to boosted output 435 to yield a high frequency boosted output 485.

The operation of mimic filter circuit 400 is similar to that of DFIR circuit 330 except that it does not react quickly to any changes in filtered output 376. Rather, mimic filter circuit 400 only indirectly reacts to changes in filtered output 376 after the effect of filtered output 376 on DFIR circuit 330 is allowed to propagated through detector circuit 340 and then be formatted as the respective feedback signals. This results in semi-independent loop circuits that enhance loop stability without requiring limitations on the range of filtered output 376.

Figure 5:
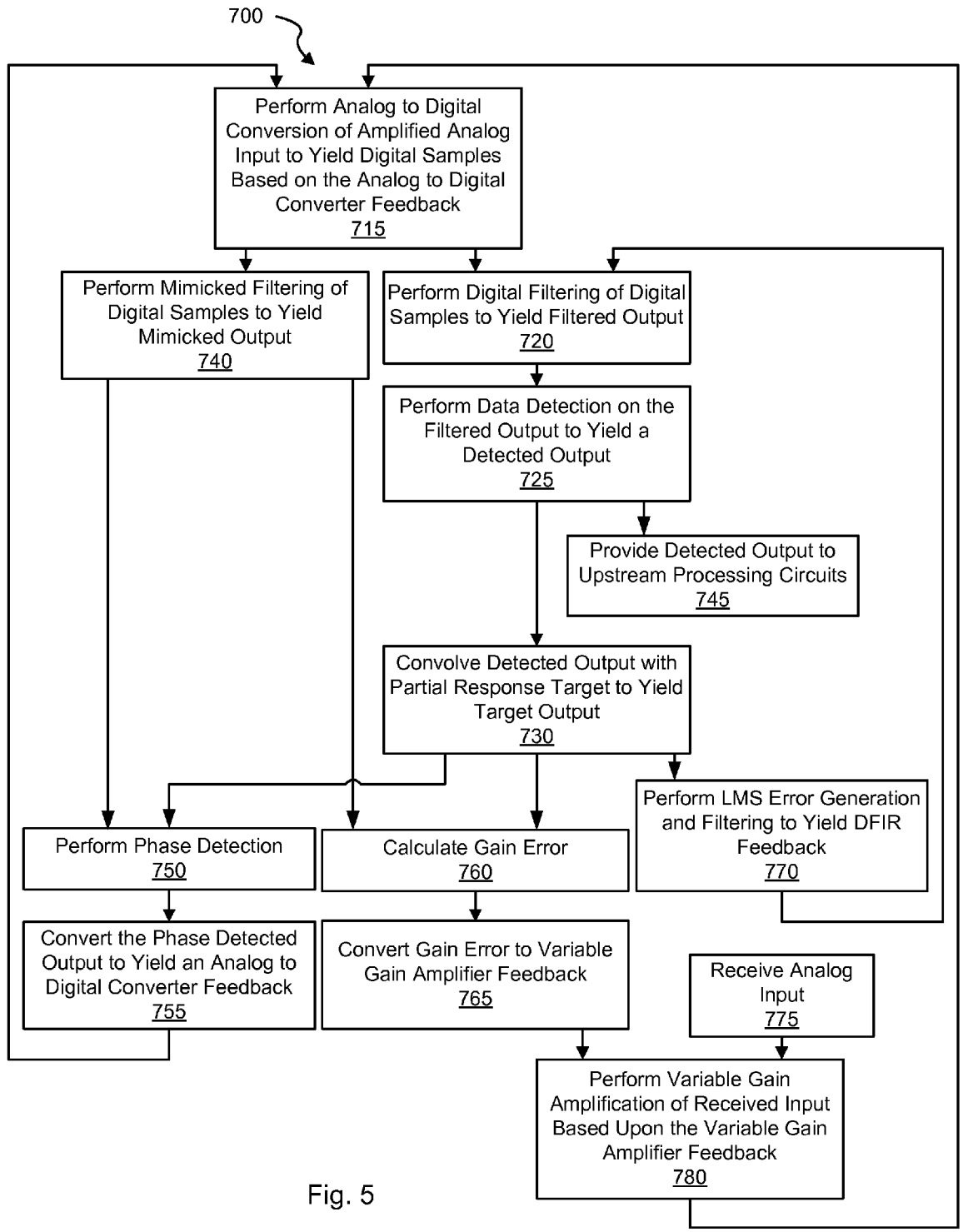
FIG. 5 is a flow diagram showing a method for semi-independent loop processing in accordance with various embodiments of the present invention.

Turning to FIG. 5, a flow diagram 700 shows a method for semi-independent loop processing in accordance with various embodiments of the present invention. Following flow diagram 700, an analog input signal is received (block 775). In some cases, the analog input signal is derived from a storage medium. In other cases, the analog input signal is derived from a transmission medium. Based upon the disclosure provided herein, one of ordinary skill in the art will recognize other sources from which the analog input signal may be derived. A variable gain amplification is applied to the received analog input signal to yield an amplified analog input signal (block 780). The magnitude of the amplification applied by the variable gain amplification is governed at least in part by an amplifier feedback signal. An analog to digital conversion is performed on the amplified analog input to yield a series of digital samples (block 715). The digital samples are generated synchronous to a sample clock that is adjusted based upon feedback from previous processing.

Digital filtering is applied to the digital data samples to yield a filtered output (block 720). In some embodiments of the present invention, the digital filtering is done by a digital finite impulse response circuit as is known in the art. A data detection process is then applied to the filtered output to yield a detected output (block 725). The detection process may be any data detection process known in the art including, but not limited to, a Viterbi algorithm detection process or a maximum a posteriori detection process. The resulting detected output is provided both as an output to an upstream processing circuit (block 745) and to a convolution filter circuit (block 730). The convolution filter circuit convolves the detected output with a partial response target to yield a target output. Using the target output, a least mean squared error is generated and the error is filtered to yield a DFIR feedback signal that at least in part governs the operation of the digital filtering performed in block 720 (block 770).

A mimicked filtering of the digital data samples from block 715 is performed to yield a mimicked output (block 740). In some cases, this includes performing a function on the received digital data samples that approximates the filtering function applied in block 720, but without reacting directly to the feedback provided to block 720. In one particular embodiment of the present invention, the mimicked filtering includes performing a low pass filtering of the digital data samples to yield a low pass output and a high pass filtering of the digital data samples including an amplification of the high frequency components of the digital data samples to yield a boosted high pass signal. The boosted high pass signal is then summed with the low pass signal to yield the mimicked output.

A phase difference detection is performed to determine a phase difference between the mimicked output and the target output (block 750). The phase error is then filtered and interpolated, with the output of the interpolation process being used to provide a feedback signal (i.e., a sampling clock) that is used in the analog to digital conversion process of block 715 (block 755).

A gain error is calculated based upon the target output and the mimicked output (block 760). The gain error is then filtered and converted from the digital domain to the analog domain to yield an analog gain feedback signal (block 765). The gain feedback signal at least in part governs the magnitude of the amplification applied by the variable gain amplification of block 780. Of note, blocks 720, 725, 730, 770 is a DFIR adaptation loop; blocks 720, 725, 730, 740, 760, 765, 780, 715 is an automatic gain control loop; and blocks 720, 725, 730, 740, 750, 755, 715 is a timing recovery loop. By introducing mimicked filtering of block 740 in place of relying exclusively on the filtering of block 720, both the automatic gain control loop and the timing recovery loop operate semi-independently as they are not directly impacted by the DFIR feedback of block 770.

Figure 6:
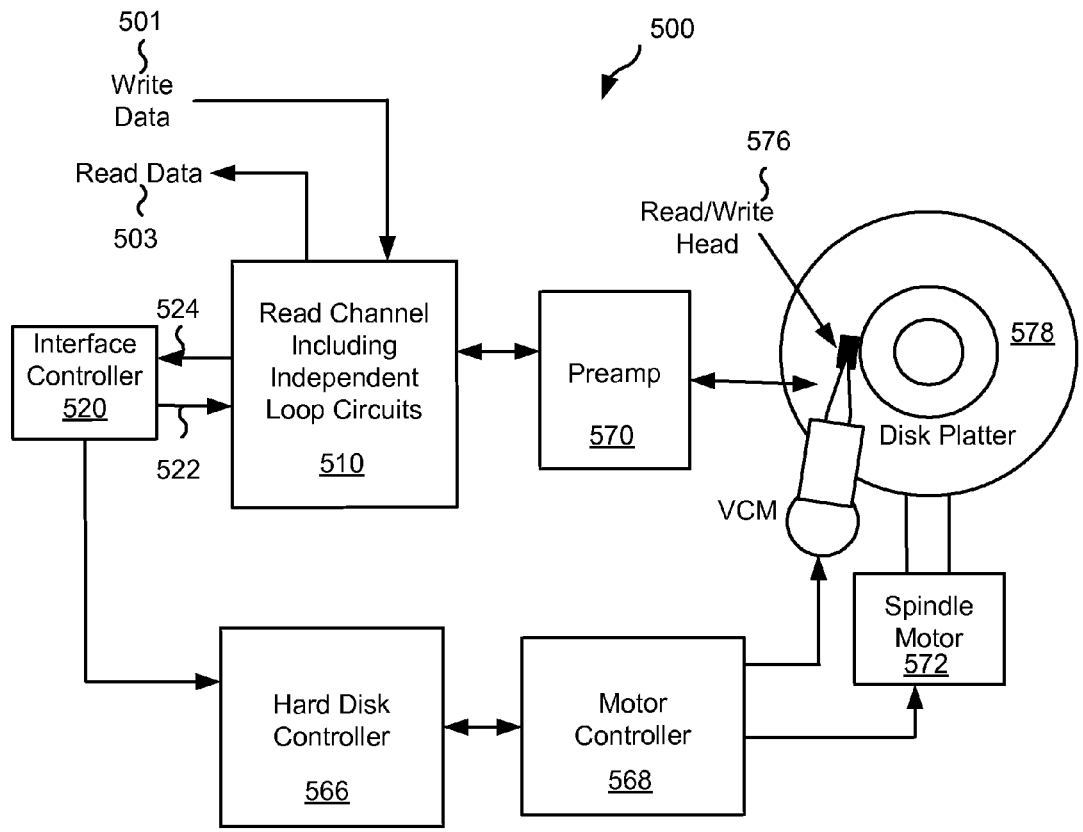
FIG. 6 shows a storage system including a read channel circuit with semi-independent loop circuits in accordance with some embodiments of the present invention.

FIG. 6 shows a storage system 500 including a read channel circuit 510 with semi-independent loop circuits in accordance with some embodiments of the present invention. Storage system 500 may be, for example, a hard disk drive. Storage system 500 also includes a preamplifier 570, an interface controller 520, a hard disk controller 566, a motor controller 568, a spindle motor 572, a disk platter 578, and a read/write head assembly 576. Interface controller 520 controls addressing and timing of data to/from disk platter 578. The data on disk platter 578 consists of groups of magnetic signals that may be detected by read/write head assembly 576 when the assembly is properly positioned over disk platter 578. In one embodiment, disk platter 578 includes magnetic signals recorded in accordance with either a longitudinal or a perpendicular recording scheme.

In a typical read operation, read/write head assembly 576 is accurately positioned by motor controller 568 over a desired data track on disk platter 578. Motor controller 568 both positions read/write head assembly 576 in relation to disk platter 578 and drives spindle motor 572 by moving read/write head assembly to the proper data track on disk platter 578 under the direction of hard disk controller 566. Spindle motor 572 spins disk platter 578 at a determined spin rate (RPMs). Once read/write head assembly 578 is positioned adjacent the proper data track, magnetic signals representing data on disk platter 578 are sensed by read/write head assembly 576 as disk platter 578 is rotated by spindle motor 572. The sensed magnetic signals are provided as a continuous, minute analog signal representative of the magnetic data on disk platter 578. This minute analog signal is transferred from read/write head assembly 576 to read channel circuit 510 via preamplifier 570. Preamplifier 570 is operable to amplify the minute analog signals accessed from disk platter 578. In turn, read channel circuit 510 decodes and digitizes the received analog signal to recreate the information originally written to disk platter 578. This data is provided as read data 503 to a receiving circuit. As part of decoding the received information, read channel circuit 510 processes the received signal using a data processing circuit including semi-independent loops similar to that discussed above in relation to FIGS. 3-5. A write operation is substantially the opposite of the preceding read operation with write data 501 being provided to read channel circuit 510. This data is then encoded and written to disk platter 578.

It should be noted that storage system 500 may be integrated into a larger storage system such as, for example, a RAID (redundant array of inexpensive disks or redundant array of independent disks) based storage system. It should also be noted that various functions or blocks of storage system 500 may be implemented in either software or firmware, while other functions or blocks are implemented in hardware.

Figure 7:
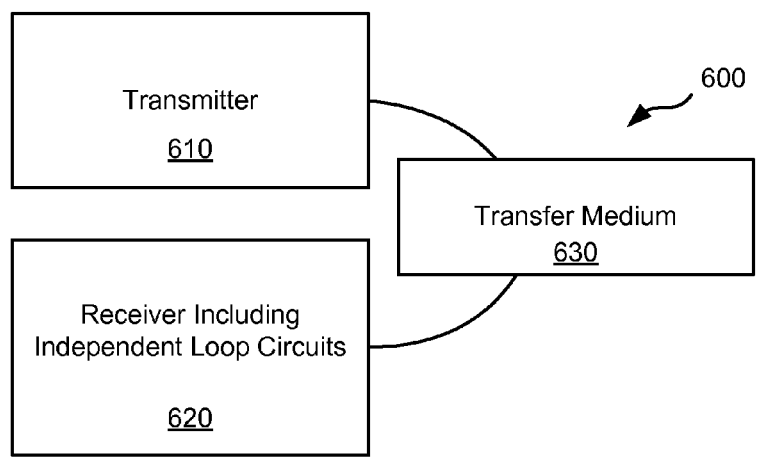
FIG. 7 depicts a wireless communication system including semi-independent loop circuits in accordance with some embodiments of the present invention.

Turning to FIG. 7, a wireless communication system 600 including a receiver with semi-independent loop circuits is shown in accordance with some embodiments of the present invention. Communication system 600 includes a transmitter 610 that is operable to transmit encoded information via a transfer medium 630 as is known in the art. The encoded data is received from transfer medium 630 by receiver 620. Receiver 620 incorporates semi-independent loop circuits similar to that discussed above in relation to FIGS. 3-5.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing circuit, the data processing circuit comprising:
    an analog to digital converter circuit operable to receive a data input and to provide corresponding digital samples;
    a digital filter circuit operable to receive the digital samples and to provide a filtered output;
    a data detector circuit operable to perform a data detection process on the filtered output to yield a detected output;
    a mimic filter circuit operable to receive the digital samples and to provide a mimicked output; and
    a sample clock generation circuit operable to provide a sample clock based at least in part on the detected output and the mimicked output.

2. The data processing circuit of claim 1, wherein the circuit further comprises:
    a digital filter loop circuit operable to provide a feedback control to the digital filter circuit, wherein the feedback control is based at least in part on the detected output.

3. The data processing circuit of claim 2, wherein the digital filter loop circuit includes:
    an error generator circuit operable to provide an error output based at least in part on a derivative of the detected output.

4. The data processing circuit of claim 3, wherein the circuit further comprises:
    a partial response target circuit operable to convolve the detected output with a target to yield the derivative of the detected output.

5. The data processing circuit of claim 2, wherein the sample clock generation circuit includes:
    a phase detector circuit operable to provide a phase error between derivative of the detected output and the mimicked output; and
    an interpolator circuit operable to interpolate a derivative of the phase error to yield the sample clock.

6. The data processing circuit of claim 5, wherein the circuit further comprises:
    a partial response target circuit operable to convolve the detected output with a target to yield the derivative of the detected output.

7. The data processing circuit of claim 2, wherein the circuit further comprises:
    a variable gain amplifier circuit operable to amplify an analog input and to provide the data input; and
    an automatic gain control loop circuit operable to provide a gain control feedback based at least in part on the mimicked output and a derivative of the detected output, and wherein the gain control feedback at least in part controls the amplification applied by the variable gain amplifier circuit.

8. The data processing circuit of claim 7, wherein the automatic gain control loop circuit includes:
    an automatic gain control error forming circuit operable to provide a gain control error based at least in part on the derivative of the detected output and the mimicked output; and
    a digital to analog converter circuit operable to convert the gain control error to the gain control feedback.

9. The data processing circuit of claim 8, wherein the circuit further comprises:
    a partial response target circuit operable to convolve the detected output with a target to yield the derivative of the detected output.

10. The data processing circuit of claim 1, wherein the circuit is implemented as part of a device selected from a group consisting of: a storage device and a receiving device.

11. The data processing of claim 1, wherein the mimic filter circuit includes:
    a high pass filter circuit operable to amplify a high frequency component of the digital samples and to yield a boosted output;
    a low pass filter circuit operable to cutoff a high frequency component of the digital samples to yield a low pass output; and
    a summation circuit operable to sum the low pass output and the high boosted output to yield the mimicked output.

12. The data processing circuit of claim 1, wherein the data processing circuit is implemented as part of an integrated circuit.

13. A data processing circuit, the data processing circuit comprising:
    a variable gain amplifier circuit operable to amplify an analog input and to provide a data input;

an analog to digital converter circuit operable to receive a data input and to provide corresponding digital samples;

a digital filter circuit operable to receive the digital samples and to provide a filtered output;

a data detector circuit operable to perform a data detection process on the filtered output to yield a detected output;

a mimic filter circuit operable to receive the digital samples and to provide a mimicked output; and an automatic gain control loop circuit operable to provide a gain control feedback based at least in part on the mimicked output and a derivative of the detected output, and wherein the gain control feedback at least in part controls the amplification applied by the variable gain amplifier circuit.

14. The data processing circuit of claim 13, wherein the automatic gain control loop circuit includes:

an automatic gain control error forming circuit operable to provide a gain control error based at least in part on the derivative of the detected output and the mimicked output; and a digital to analog converter circuit operable to convert the gain control error to the gain control feedback.

15. The data processing circuit of claim 13, wherein the circuit further comprises:

a digital filter loop circuit operable to provide a feedback control to the digital filter circuit, wherein the feedback control is based at least in part on the detected output.

16. The data processing circuit of claim 15, wherein the digital filter loop circuit includes:

an error generator circuit operable to provide an error output based at least in part on a derivative of the detected output.

17. The data processing circuit of claim 13, wherein the circuit further comprises:

a sample clock generation circuit operable to provide a sample clock to the analog to digital converter circuit, wherein the sample clock is based at least in part on the detected output and the mimicked output.

18. The data processing circuit of claim 17, wherein the sample clock generation circuit includes:

a phase detector circuit operable to provide a phase error between derivative of the detected output and the mimicked output; and an interpolator circuit operable to interpolate a derivative of the phase error to yield the sample clock.

19. The data processing circuit of claim 13, wherein the circuit is implemented as part of a device selected from a group consisting of: a storage device and a receiving device.

20. The data processing circuit of claim 13, wherein the mimic filter circuit includes:

a high pass filter circuit operable to amplify a high frequency component of the digital samples and to yield a boosted output;

a low pass filter circuit operable to cutoff a high frequency component of the digital samples to yield a low pass output; and a summation circuit operable to sum the low pass output and the high boosted output to yield the mimicked output.

21. The data processing circuit of claim 13, wherein the data processing circuit is implemented as part of an integrated circuit.

22. A method for data processing, the method comprising:

performing a variable gain amplification on an analog input using a variable gain amplifier circuit to yield an analog output, wherein a magnitude of the variable gain amplification is controlled at least in part by an analog feedback signal;

performing an analog to digital conversion on the analog output to yield a series of digital samples, wherein each of the series of digital samples is synchronous to a sample clock;

performing a digital filtering of the digital samples using a digital filter circuit to yield a filtered output, wherein the digital filtering is at least in part controlled by a filter feedback;

performing a data detection process on the filtered output to yield a detected output;

performing a mimicked filtering of the digital samples to yield a mimicked output;

generating the filter feedback to the digital filter circuit based at least in part on a derivative of the detected output;

generating the analog feedback signal to the variable gain amplifier circuit based at least in part on a combination of the mimicked output and a derivative of the detected output; and generating the sample clock based at least in part on a combination of the mimicked output and a derivative of the detected output.

* * * * *